United States Patent
Shih et al.

(10) Patent No.: US 9,368,722 B2
(45) Date of Patent: Jun. 14, 2016

(54) RESISTIVE RANDOM ACCESS MEMORY AND MANUFACTURING METHOD THEREOF

(71) Applicant: TAIWAN SEMICONDUCTOR MANUFACTURING COMPANY LTD., Hsinchu (TW)

(72) Inventors: Sheng-Hung Shih, Hsinchu (TW); Wen-Ting Chu, Kaohsiung (TW); Kuo-Chi Tu, Hsin-Chu (TW); Yu-Wen Liao, New Taipei (TW); Chih-Yang Chang, Changhua County (TW); Chin-Chieh Yang, New Taipei (TW); Hsia-Wei Chen, Taipei (TW); Wen-Chun You, Yilan County (TW); Chih-Ming Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/019,857

(22) Filed: Sep. 6, 2013

(65) Prior Publication Data
US 2015/0069315 A1    Mar. 12, 2015

(51) Int. Cl.
*H01L 45/00* (2006.01)

(52) U.S. Cl.
CPC .............. *H01L 45/16* (2013.01); *H01L 45/08* (2013.01); *H01L 45/1233* (2013.01); *H01L 45/1246* (2013.01); *H01L 45/1273* (2013.01); *H01L 45/146* (2013.01); *H01L 45/1608* (2013.01)

(58) Field of Classification Search
CPC ..... H01L 45/08; H01L 45/16; H01L 45/1233; H01L 45/1608; H01L 45/1273; H01L 45/146; H01L 45/1246
See application file for complete search history.

(56) References Cited

U.S. PATENT DOCUMENTS

| 6,369,403 | B1* | 4/2002 | Holonyak, Jr. | 257/13 |
|---|---|---|---|---|
| 2006/0263593 | A1* | 11/2006 | Aziz et al. | 428/328 |
| 2007/0090444 | A1* | 4/2007 | Park et al. | 257/314 |
| 2009/0027944 | A1* | 1/2009 | Ufert | B82Y 10/00 365/148 |
| 2010/0056363 | A1* | 3/2010 | Lee | 502/167 |
| 2011/0081109 | A1* | 4/2011 | Thylen et al. | 385/30 |
| 2012/0200817 | A1* | 8/2012 | Tweet et al. | 349/139 |
| 2013/0168632 | A1* | 7/2013 | Moon et al. | 257/4 |
| 2014/0239365 | A1* | 8/2014 | Lee et al. | 257/316 |

* cited by examiner

*Primary Examiner* — Matthew Reames
(74) *Attorney, Agent, or Firm* — WPAT, P.C., Intellectual Property Attorneys; Anothony King

(57) ABSTRACT

One embodiment in the present disclosure provides a resistor in a resistive random access memory (RRAM). The resistor includes a first electrode; a resistive layer on the first electrode; an electric field enhancement array in the resistive layer; and a second electrode on the resistive layer. The electric field enhancement array includes a plurality of electric field enhancers arranged in a same plane. One embodiment in the present disclosure provides a method of manufacturing a resistor structure in an RRAM. The method comprises (1) forming a first resistive layer on a first electrode; (2) forming a metal layer on the resistive layer; (3) patterning the metal layer to form a metal dot array on the resistive layer; and (4) forming a second electrode on the metal dot array. The metal dot array comprises a plurality of metal dots, and a distance between adjacent metal dots is less than 40 nm.

11 Claims, 18 Drawing Sheets

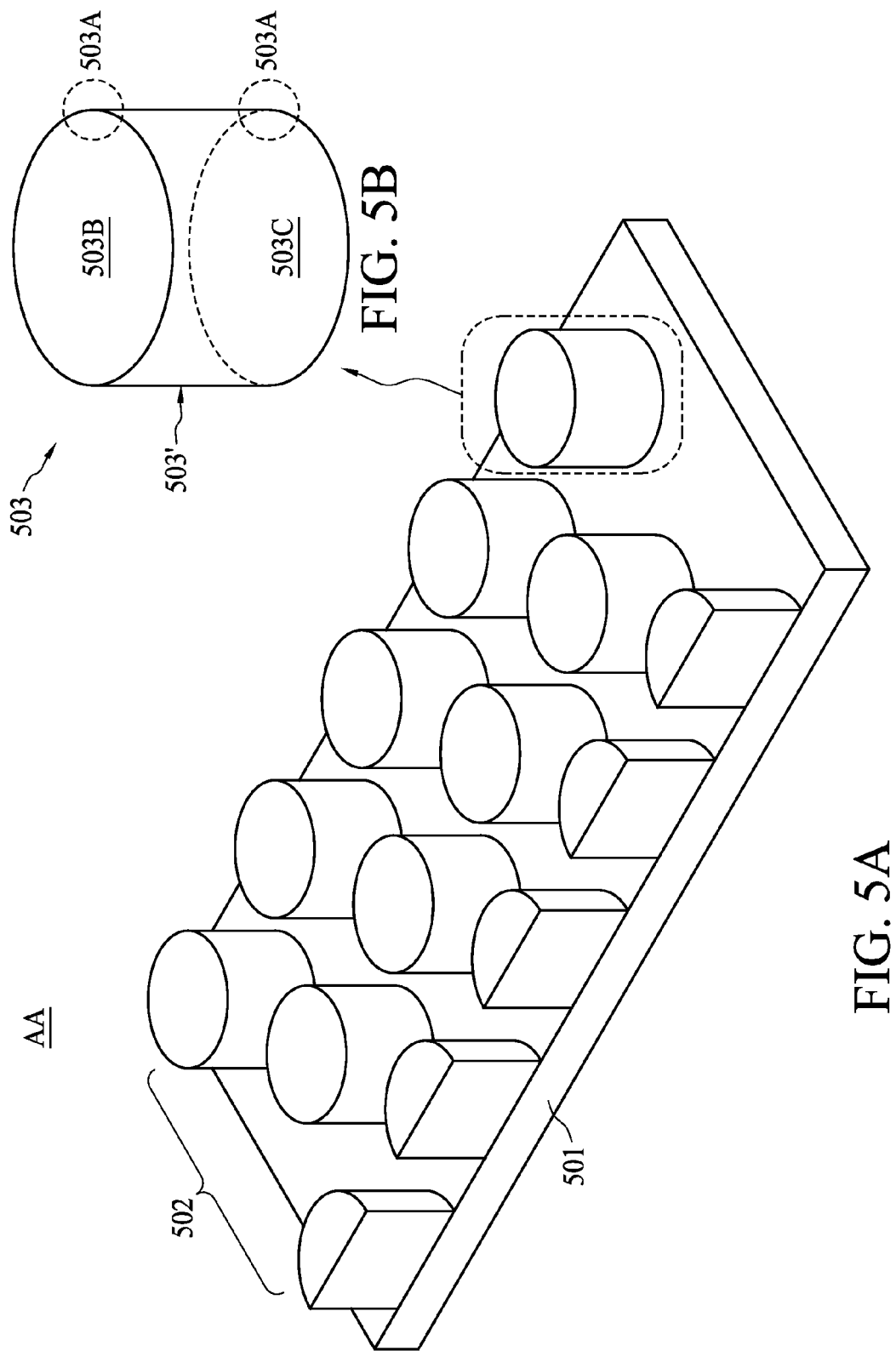

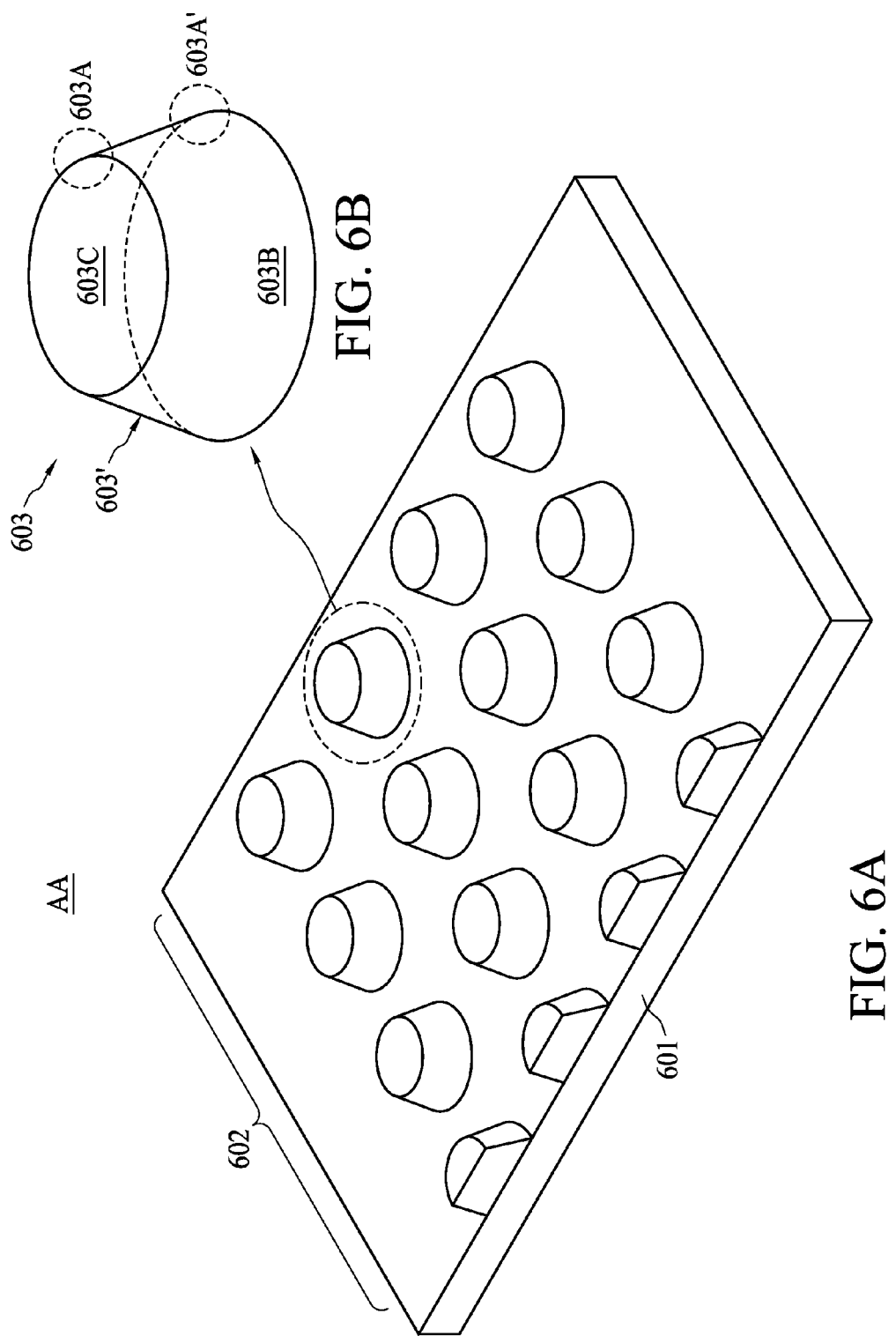

RESISTIVE RANDOM ACCESS MEMORY AND MANUFACTURING METHOD THEREOF

FIELD

The present disclosure relates to a resistor structure in a resistive random access memory.

BACKGROUND

A semiconductor memory array includes a plurality of unit memory cells that are electrically connected to one another. In dynamic random access memory (DRAM), for example, a unit memory cell may include one switch and one capacitor. A DRAM has high integration density and high operation speed. However, when power is not supplied to the DRAM, data stored in the DRAM is erased. An example of non-volatile memory is flash memory, in which stored data is not erased when power is not supplied. Although flash memory has non-volatile characteristics, flash memory has low integration density and low operation speed as compared to DRAM.

Resistive random access memory (RRAM) is one of the non-volatile memory devices. An RRAM is a resistive type memory based on a characteristic that a resistance of a transition metal oxide varies according to a voltage applied thereto, and the resistance is used to store a bit of data in an RRAM cell instead of an electronic charge used in the DRAM. An RRAM consists of a capacitor like structure in which the insulating materials show a resistive switching behavior.

Conductive paths or so-called conductive filaments (CF) are formed in such insulating materials after an electroforming step. After the generation of the CF, when passing a current through the capacitor like structure, a low resistance state (LRS) is identified, indicating a digital signal "0" or "1". The RRAM can then be RESET by receiving a voltage high enough to break the CF in the insulating materials, wherein a high resistance state (HRS) is identified, indicating a digital signal "1" or "0". The two states (LRS, HRS) of the RRAM are reversible based on a voltage applied thereto.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5A is a perspective view of an electric field enhancement array in an RRAM according to some embodiments of the present disclosure;

FIG. 5B is an enlarged perspective view of an electric field enhancer in an RRAM according to some embodiments of the present disclosure;

FIG. 6A is a perspective view of an electric field enhancement array in an RRAM according to some embodiments of the present disclosure;

FIG. 6B is an enlarged perspective view of an electric field enhancer in an RRAM according to some embodiments of the present disclosure;

DETAILED DESCRIPTION OF THE INVENTION

Figure 1:
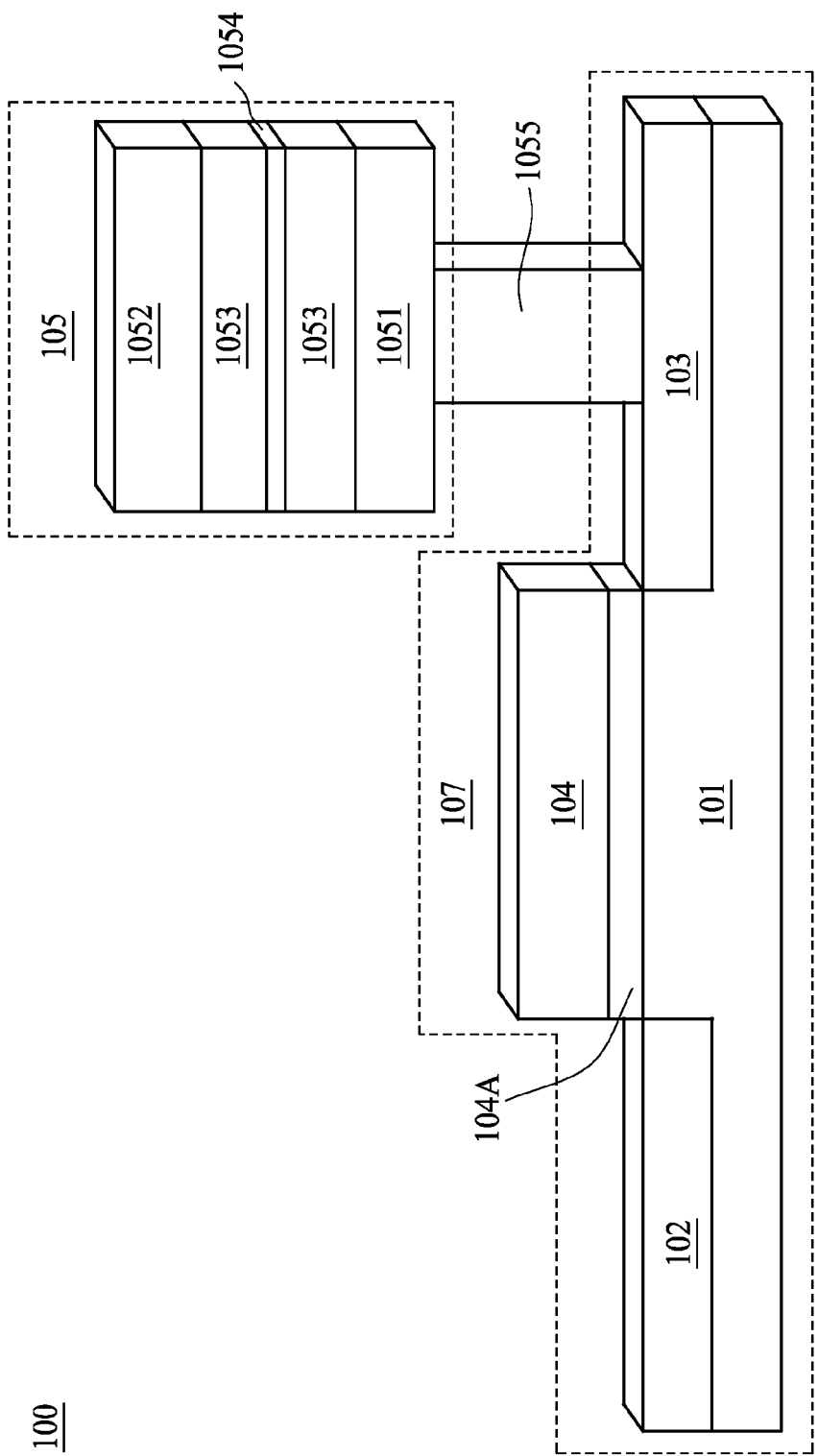
FIG. 1 is a 1-transistor-1-resistor (1T1R) structure of an RRAM according to some embodiments of the present disclosure.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

The formation and the rupture of the conductive filaments (CF) are attributed to be related to the defects, for example oxygen vacancies, in the insulating layer in the RRAM. The nature of the conduction mechanism of the above mobile defect specie is not clearly understood and hence the specific positions where the CF are generated in the insulating layer are not controllable.

It is believed that due to some processing variations, sharp features such as sharp concave or sharp convex structures on either the surface or the bottom of the insulating layer effectively create a high electric field. The CF are typically easier to form at certain positions with enhanced electric field than other regions without such sharp features. Surface morphologies of the sharp features normally include parabolas with small radius of curvature, sharp bent, or a cusp. For example, surface roughness of the insulating layer usually takes part as a source of the sharp features.

The process window of the deposition of the insulating layer shall be precisely controlled in order to maintain a uniform surface roughness throughout the wafer. If the surface roughness is high in certain regions but comparatively low in other regions, the CF formation follows the above distribution. The CF are easier to form at the region with higher surface roughness and less likely to form at the region with low surface roughness given the same voltage applied.

In order to solve the problem of lack of control in the position and the density of the CF formation in the insulating layer of an RRAM, some embodiments in the present disclosure provide an electric filed enhancement layer that induces greater electric field in predetermined positions. The CF are inclined to form at the predetermined positions where features of the electric filed enhancement layer reside and thus the filament formation becomes predictable and controllable in an RRAM.

Definitions

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as Ga As, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HD-PCVD), low pressure CVD (LPCVD), and the like. Examples of deposition using electrochemical reaction include electroplating, electro-less plating, and the like. Other examples of deposition includes pulse laser deposition (PLD), and atomic layer deposition (ALD).

As used herein, "metal oxide" refers to binary metal oxides, transition metal oxides, and lanthanide series metal oxides. The metal oxides described herein are often non-soichiometric, thus a subscript "x" for the oxygen composition is used in the present disclosure. The metal oxide includes $MgO_x$, $AlO_x$, $TiO_x$, $CrO_x$, $MnO_x$, $FeO_x$, $CoO_x$, $NiO_x$, $CuO_x$, $ZnO_x$, $GeO_x$, $YO_x$, $ZrO_x$, $NbO_x$, $MoO_x$, $SnO_x$, $LaO_x$, $HfO_x$, $TaO_x$, $WO_x$, $CeO_x$, $GdOx$, $YbO_x$, and $LuO_x$.

The problems and needs outlined above are addressed by embodiments of the present disclosure. FIG. 1 is a typical 1-transistor-1-resistor (1T1R) structure 100 of an RRAM with an electric field enhancement array 1054 inside a capacitor-like structure 105. In some embodiments, the capacitor-like structure 105 includes a first electrode 1051, a second electrode 1052, and a resistive layer 1053 between the first electrode 1051 and the second electrode 1052. In some embodiments, the electric filed enhancement array 1054 is embedded in the resistive layer 1053 as shown in the 1T1R structure 100 of FIG. 1. One end of a conductor 1055 is electrically connected to the first electrode 1051 of the capacitor-like structure 105, and the other end of the conductor 1055 is electrically connected to a drain region 103 of a transistor 107.

The transistor 107 shown in FIG. 1 includes a substrate 101, a source 102, a drain 103, a gate 104, and an oxide layer 104A between the substrate 101 and the gate 104. Voltage difference between the first electrode 1051 (or effectively drain 103) and the second electrode 1052 triggers the forming, the SET, and the RESET process of the conductive filaments (CF) in the resistive layer 1053 of the capacitor-like structure 105.

Referring to FIG. 1, in some embodiments, the electric field enhancement array 1054 includes several electric field enhancers (not shown) arranged on a same plane of the resistive layer 1053. In some embodiments, the resistive layer 1053 is a resistor. In certain embodiments, the electric field enhancer is a metal dot. The metal dot is not limited to a shape of sphere but also including a shape of a cylinder, a tapered cone, and a pyramid. In certain embodiments, the metal dot has a shape of any form with a defined position that is distinguishable from another defined position of the adjacent metal dot. In certain embodiments, the metal dot has a shape with several sharp bents.

The shapes of metal dots in a metal dot array do not have to be identical. In some embodiments, a portion of the metal dots in the metal dot array have a shape of cylinder, another portion of the metal dos in the metal dot array have a shape of a tapered cone.

Referring to FIG. 1, in some embodiments, the electric field enhancement array 1054 includes several electric field enhancers (not shown) arranged on a same plane of the resistive layer 1053. In certain embodiments, the electric field enhancer is a metal stripe. The metal strip is arranged on a plane of the resistive layer 1053 in a parallel or an orthogonal fashion. In some embodiments, a cross section of the metal stripe is, but not limited to, a conical shape, a circular shape, a triangular shape, or a quadrilateral shape.

Figure 2:
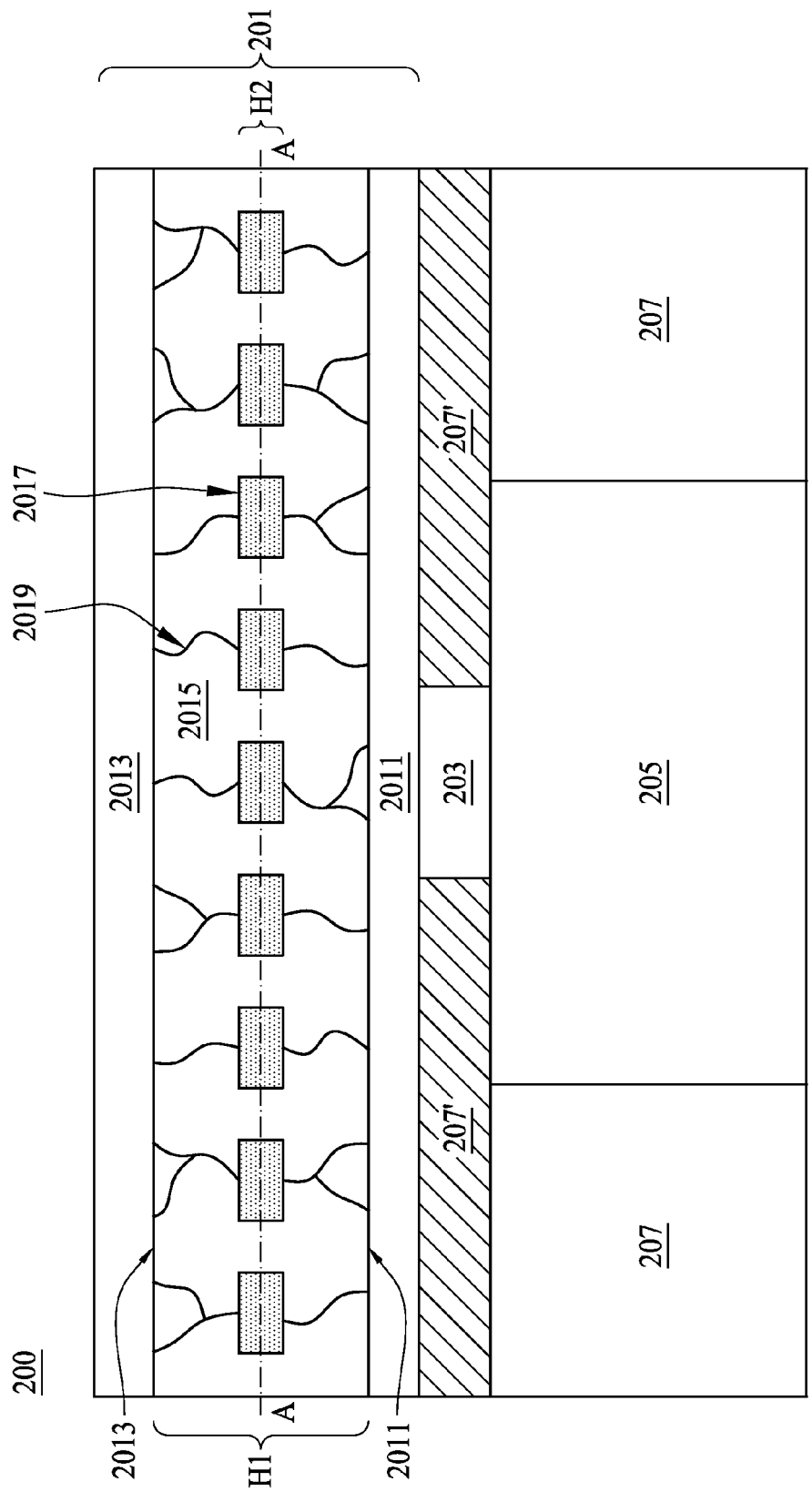
FIG. 2 is a cross sectional view of a resistor in an RRAM according to some embodiments of the present disclosure.

FIG. 2 is a cross section of a resistor structure 200 in an RRAM. The resistor structure 200 includes a capacitor-like structure 201 and a conductor 205. The capacitor-like structure 201 in FIG. 2 can be referred to the capacitor-like structure 105 in FIG. 1. In some embodiments, the capacitor-like structure 201 includes a first electrode 2011, a second electrode 2013, a resistive layer 2015, and several metal dots 2017 embedded in the resistive layer 2015. In some embodiments, the resistive layer 2015 is a resistor. One end of a conductive structure 203 is electrically connected to the first electrode 2011 of the capacitor-like structure 201, and the other end of the conductive structure 203 is electrically connected to a top surface of a conductor 205. The conductor 205 in FIG. 2 can be referred to the conductor 1055 in FIG. 1. The conductor 205 is further connected to a drain of a resistor as shown previously in FIG. 1.

In some embodiments, the first electrode 2011 and the second electrode 2013 include Pt, AlCu, TiN, Au, Ti, Ta, TaN, W, WN, Cu or combinations thereof. In some embodiments, conductive materials composing the first electrode 2011 and the second electrode 2013 include materials with proper work function such that a high work function barrier is retained at the interface of the first electrode 2011 and the resistive layer 2015, as well as at the interface of the second electrode 2013 and the resistive layer 2015.

In certain embodiments, the resistive layer 2015 includes at least one of dielectric materials having a high-k dielectric constant, binary metal oxides, transition metal oxides, and lanthanide series metal oxides. In some embodiments, the resistive layer 2015 includes nickel oxide, titanium oxide, hafnium oxide, zirconium oxide, zinc oxide, tungsten oxide, aluminum oxide, tantalum oxide, molybdenum oxide or copper oxide.

In some embodiments, the conductive structure 203 includes a conductive interconnect, a doped region, or a silicide region. In some embodiments, materials composing the conductive structure 203 include Al, Cu, Ti, Ta, W, Mo, TaN, NiSi, CoSi, TiN, WN, Si, or combination thereof.

Referring to FIG. 2, dielectric layers (207, 207') are in contact with the sidewalls of the conductive structure 203 and the conductor 205. In some embodiments, dielectric layer 207' has a better etching resistance than that of the dielectric layer 207. In certain embodiments, dielectric layer 207' acts as an etch stop when electrically separating and defining adjacent RRAM cells from each other. For example, dielectric layer 207' is an etch stop layer including at least one of silicon carbide, silicon oxynitride, and silicon nitride.

In some embodiments, dielectric layer (207, 207') includes silicon oxide, fluorinated silica glass (FSG), carbon doped silicon oxide, silicon nitride, silicon oxynitride, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric materials, or combination thereof.

Referring to FIG. 2, the electric field enhancer 2017 includes conductive materials such as Pt, AlCu, TiN, Au, TaN, W, WN, Cu, Ni, Zr, and the combination thereof. However, the electric field enhancer 2017 is not limited to materials listed above, any kinds of conductive materials are within the contemplated scope of the present disclosure.

In certain embodiments, the electric field enhancers 2017 include conductive materials that are capable of depriving oxygen from the resistive layer 2015. For example, Ti, Ta, and Hf. It is known in the art that certain metal acts as an oxygen reservoir depleting the oxygen atoms from the oxide in contact therewith. Since the resistive layer 2015 includes binary metal oxides, transition metal oxides, and lanthanide series metal oxides, oxygen atoms in said oxides are depleted from the resistive layer 2015 when brining it in contact with the oxygen-depriving metal. Consequently the oxygen vacancies being left in the resistive layer 2015 is used to assist the formation and the SET process.

Referring to FIG. 2, a thickness H1 of the resistive layer 2015 is less than 100 nm. Given that all the electric field enhancers 2017 of an electric field enhancement array is positioned on a same plane, a thickness of the electric field enhancement array is denoted H2. In some embodiments, a ratio of the thickness H2 and the thickness H1 is about 0.1. In certain embodiments, a ratio of the thickness H2 and the thickness H1 is less than 0.1.

After applying a forming voltage to the resistor structure 200 in FIG. 2, the resistor structure 200 is SET by applying a voltage lower than the forming voltage. Under this condition, filaments 2019 are formed between the electric field enhancer 2017 and the first and/or the second electrode (2011, 2013).

On the other hand, the resistor structure 200 is RESET by applying a voltage lower than the forming voltage. Under this condition, filaments 2019 formed between the electric field enhancer 2017 and the first and/or the second electrode (2011, 2013) are ruptured by the elimination of a portion of the oxygen vacancies near the first and/or the second electrode (2011, 2013).

A top view of an arrangement of the electric field enhancers 2017 along line AA is shown and described in the subsequent FIG. 5A to FIG. 7D.

Figure 3A:
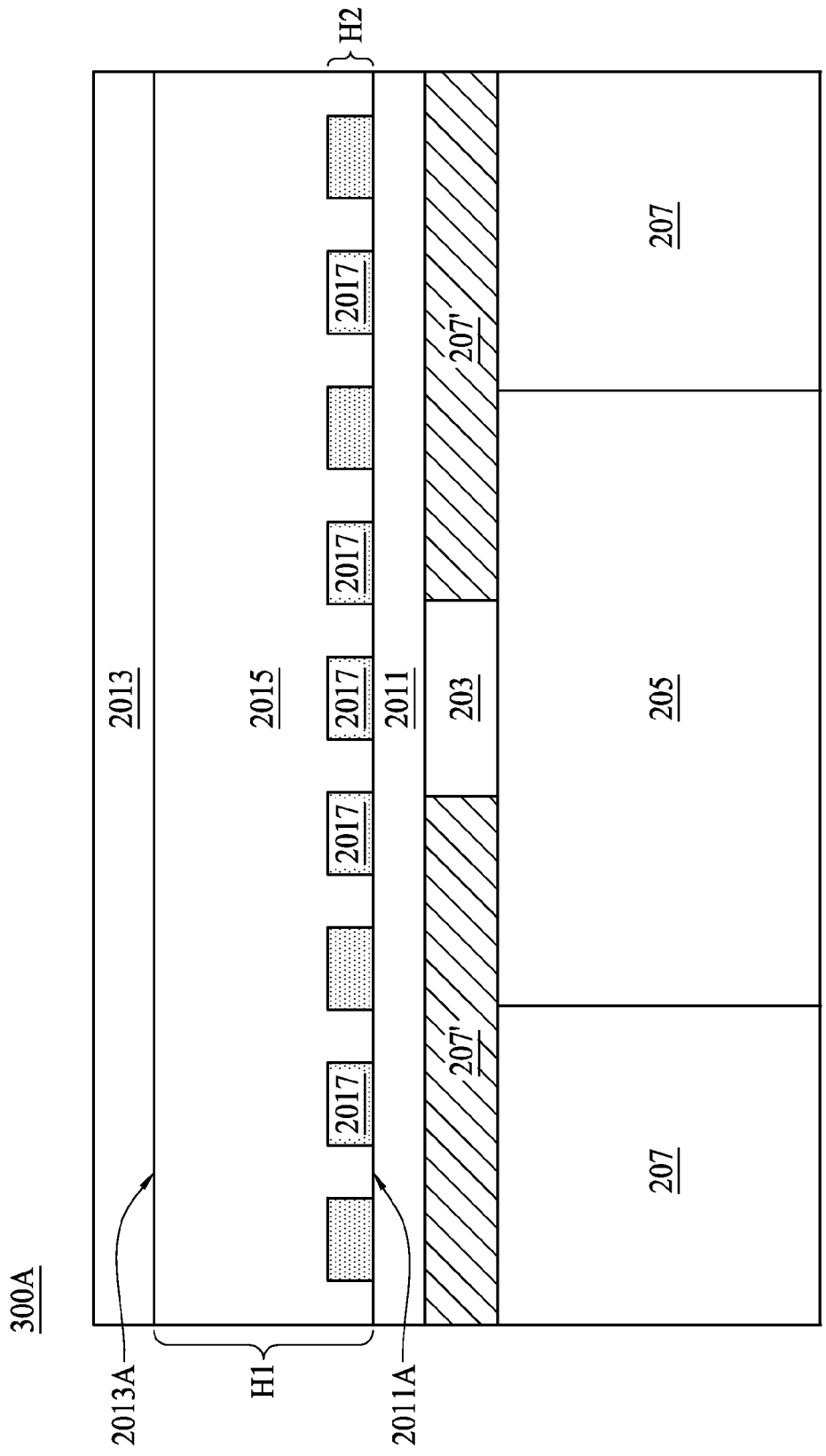
FIG. 3A and FIG. 3B are cross sectional views of resistors in an RRAM according to some embodiments of the present disclosure.
Figure 3B:
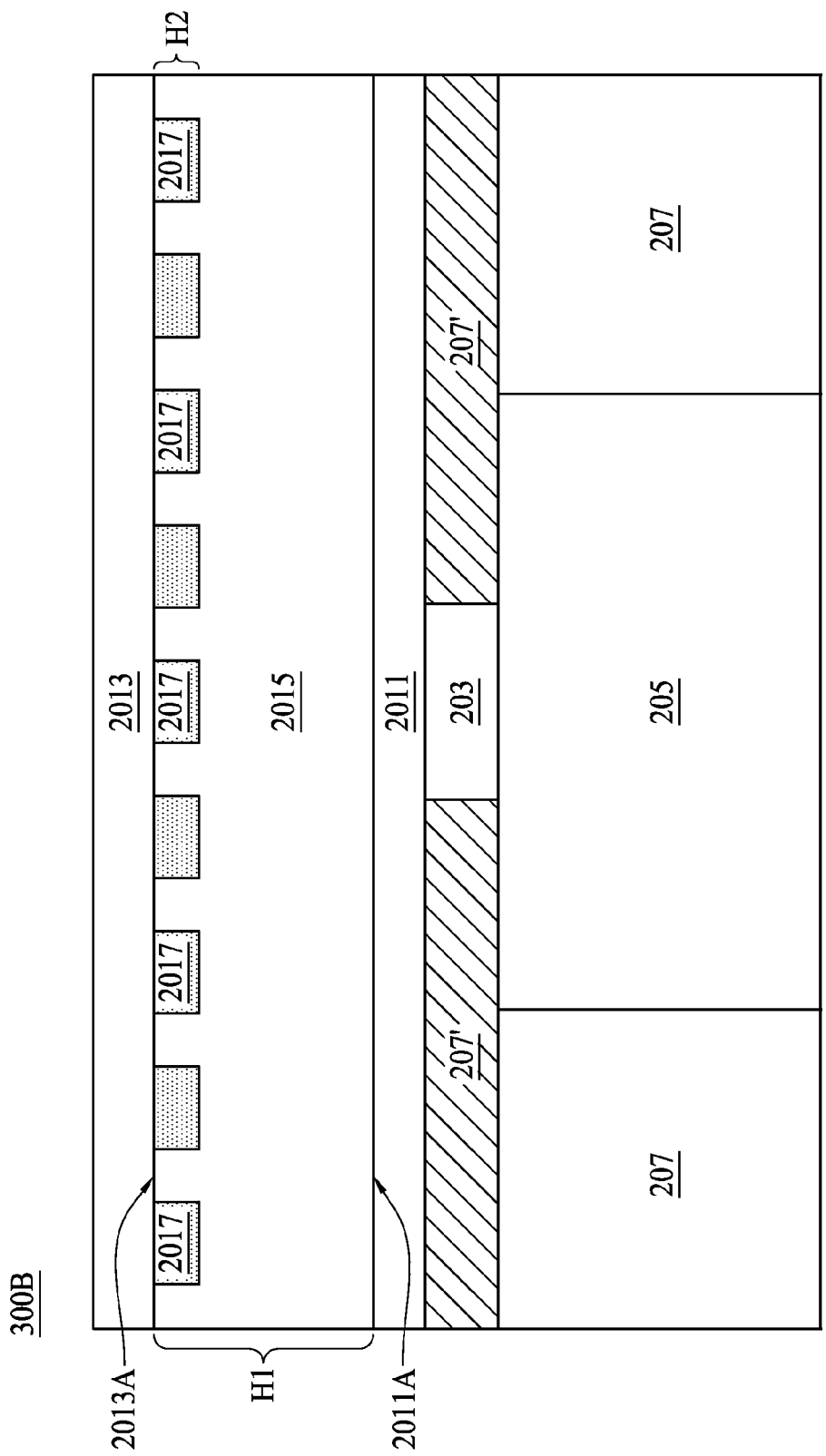

FIG. 3A and FIG. 3B are similar embodiments as described in FIG. 2. Details of the structures and materials of resistors 300A and 300B can be found in the description associated with resistor structure 200 and are not repeated here. In FIG. 3A, the electric field enhancers 2017 are positioned at a top surface 2011A of the first electrode 2011. The top surface 2011A is an interface of the first electrode 2011 and the resistive layer 2015. In some embodiments, a ratio of the thickness H2 of the electric field enhancers 2017 and the thickness H1 of the resistive layer 2015 as shown in FIG. 3A is about 0.05. In FIG. 3B, the electric field enhancers 2017 are in contact with a bottom surface 2013A of the second electrode 2013. The bottom surface 2013A is an interface of the second electrode 2013 and the resistive layer 2015. In some embodiments, a ratio of the thickness H2 of the electric field enhancers 2017 and the thickness H1 of the resistive layer 2015 as shown in FIG. 3B is about 0.08.

In certain embodiments, all the electric field enhancers do not have to be positioned on a same plane. For example, a portion of the electric field enhancers are positioned at the top surface 2011A of the first electrode 2011, another portion of the electric field enhancers are in contact with a bottom surface 2013A of the second electrode 2013, and the remaining portion of the electric field enhancers are embedded in the resistive layer 2015 without contacting the first electrode 2011 or the second electrode 2013.

Figure 4A:
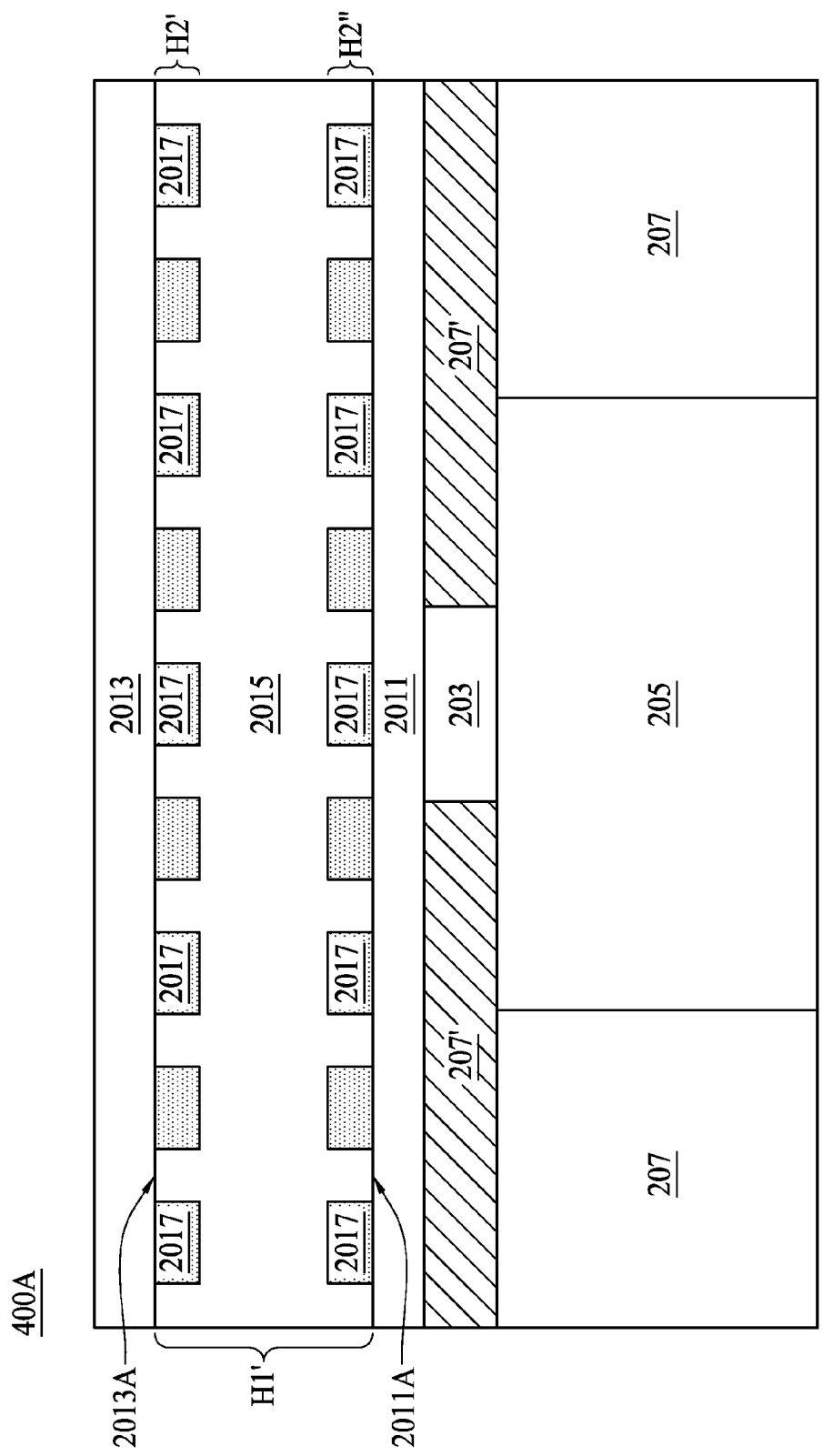
FIG. 4A and FIG. 4B are cross sectional views of resistors in an RRAM according to some embodiments of the present disclosure.
Figure 4B:
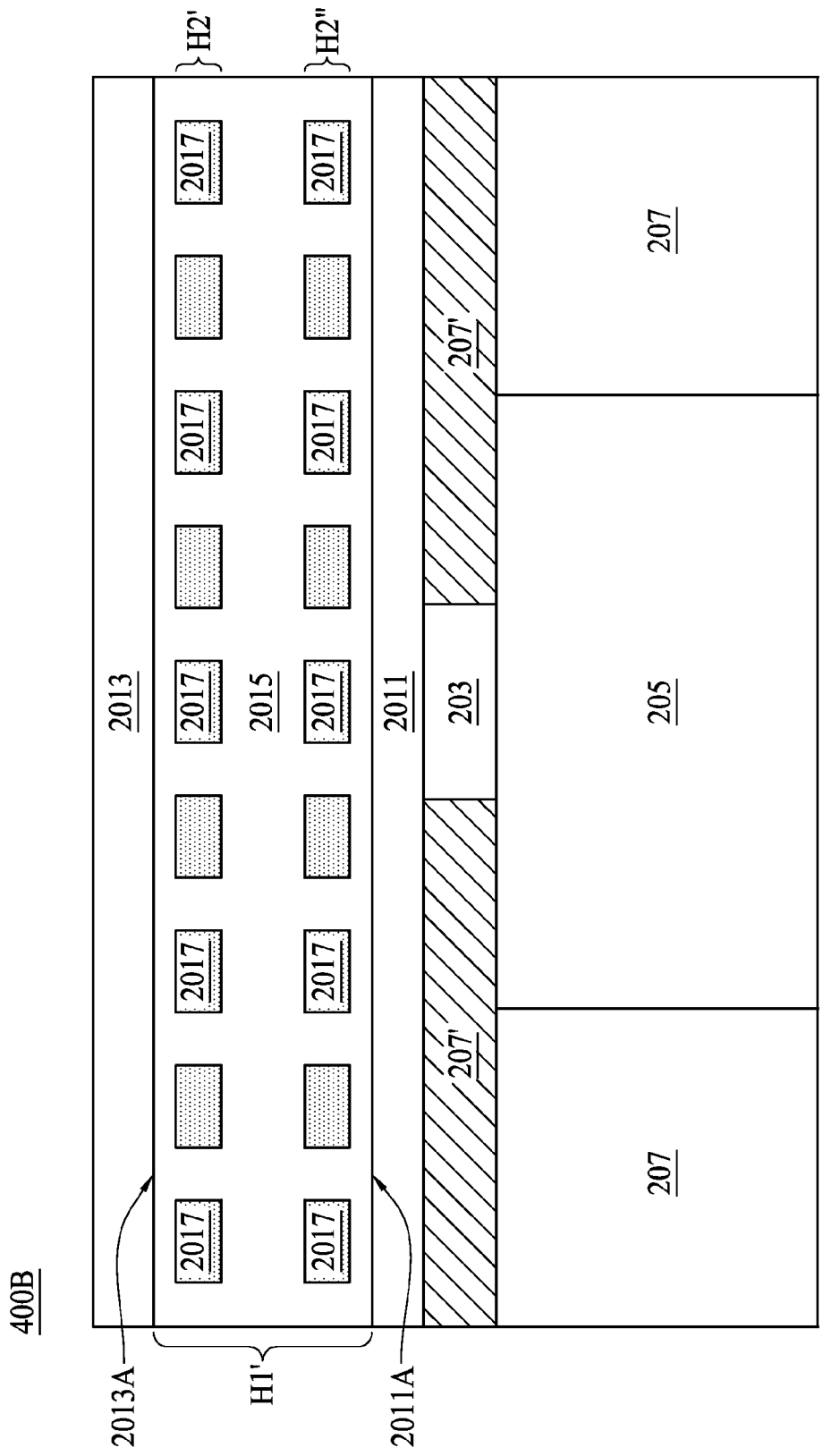

FIG. 4A and FIG. 4B are similar embodiments as described in FIG. 2. Details of the structures and materials of resistors 400A and 400B can be found in the description associated with resistor structure 200 and are not repeated here. In FIG. 4A, two electric field enhancement arrays are disposed in the resistive layer 2015. Electric field enhancers 2017 in the resistive layer 2015 are arranged in two different planes. One electric field enhancement array is positioned on the top surface 2011A of the first electrode 2011, the other electric field enhancement array is in contact with the bottom surface 2013A of the second electrode 2013. Each of the electric field enhancement array includes several electric field enhancers 2017 arranged in a two dimensional pattern. Details of the two dimensional pattern can be referred to the description associated with FIG. 5A to FIG. 7D.

In FIG. 4B, two electric field enhancement arrays are disposed in the resistive layer 2015. Electric field enhancers 2017 in the resistive layer 2015 are arranged in two different planes. Both electric field enhancement arrays are embedded in the resistive layer 2015, without contacting the first electrode 2011 and/or the second electrode 2013.

Referring back to FIG. 4A, one electric field enhancement array has a thickness of H2', another electric field enhancement array has a thickness of H2''. In some embodiments, the thickness H2' is not limited to be the same as the thickness H2''. For example, A ratio of the thickness H2' of the electric field enhancers 2017 and the thickness H1' of the resistive layer 2015 as shown in FIG. 4A is about 0.07. A ratio of the thickness H2'' of the electric field enhancers 2017 and the thickness H1' of the resistive layer 2015 as shown in FIG. 4A is about 0.05.

Referring back to FIG. 4B, one electric field enhancement array has a thickness of H2', another electric field enhancement array has a thickness of H2". In some embodiments, the thickness H2' is not limited to be the same as the thickness H2". For example, A ratio of the thickness H2' of the electric field enhancers 2017 and the thickness H1' of the resistive layer 2015 as shown in FIG. 4B is about 0.03. A ratio of the thickness H2" of the electric field enhancers 2017 and the thickness H1' of the resistive layer 2015 as shown in FIG. 4B is about 0.08.

FIG. 5A is a perspective view of the cross section along line AA in FIG. 2 according to some embodiments of the present disclosure. In FIG. 5A, an electric field enhancement array 502 including several electric field enhancers 503 is positioned on a resistive layer 501. In some embodiments, the resistive layer 501 is a resistor. Each of the electric field enhancers 503 has a cylindrical shape with essentially a same height. As shown in FIG. 5B, in some embodiments, the cylindrical shaped electric field enhancer 503 includes at least one sharp bent 503A having an angle of about or less than 90 degrees. As shown in FIG. 5A, two surfaces composing the sharp bent 503A include a sidewall 503' and a top surface 503B or a bottom surface 503C of each cylindrical shape electric field enhancer 503.

Figure 5C:
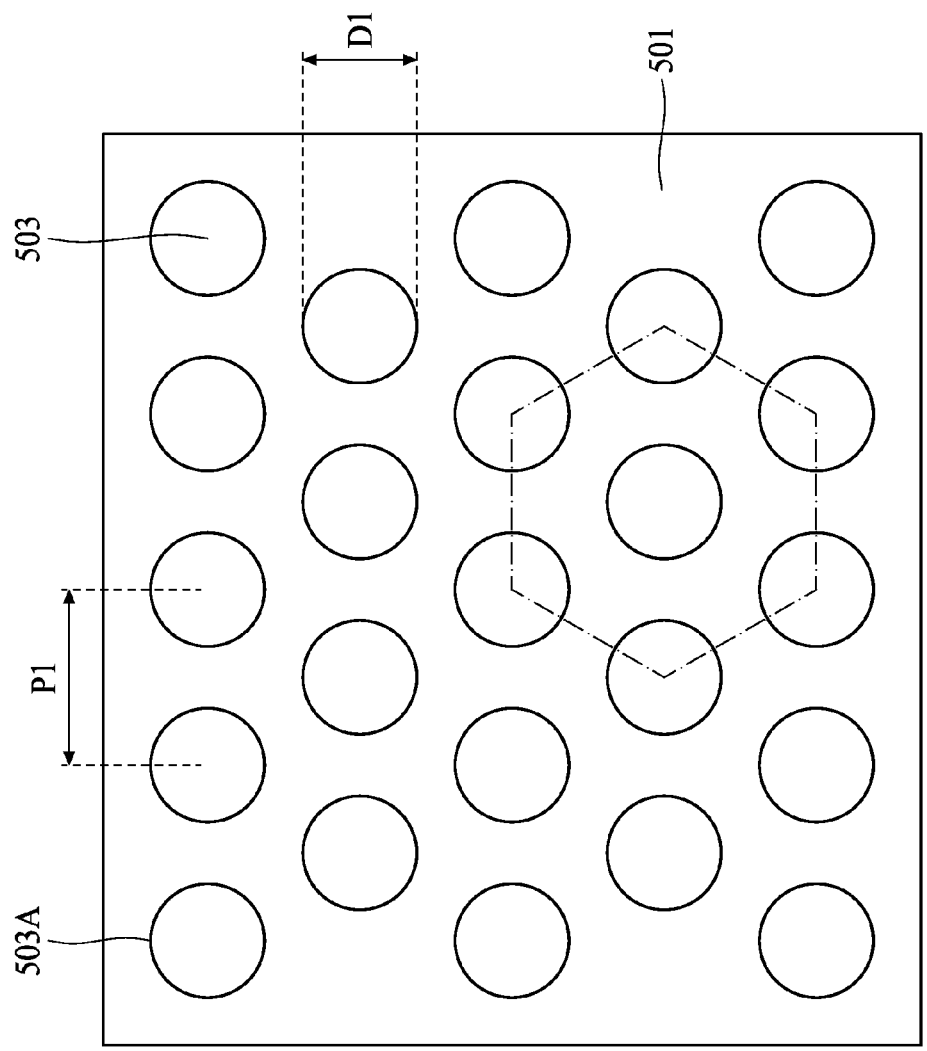
FIG. 5C is a top view of an electric field enhancement array in an RRAM according to some embodiments of the present disclosure.

FIG. 5C is a top view of the cross section along line AA in FIG. 2 according to some embodiments of the present disclosure. Referring to the description associated with FIG. 5A, several electric field enhancers 503 (metal dots) are arranged in a hexagonal symmetry on a resistive layer 501. An area surrounded by dotted lines demonstrates a hexagonal unit cell of the electric field enhancement array 502.

As shown in FIG. 5C, a separation P1 between two adjacent electric field enhancers 503 is about or less than 40 nm. A greatest dimension of the electric field enhancer 503 is a diameter D1 on a circular top surface of the cylindrical shaped electric field enhancer 503. In certain embodiments, the diameter D1 is about or less than 40 nm. In certain embodiments, the area density of the electric field enhancers 503 is 0.3 electric field enhancer per nanometer square.

FIG. 6A is a perspective view of the cross section along line AA in FIG. 2 according to some embodiments of the present disclosure. In FIG. 6A, an electric field enhancement array 602 including several electric field enhancers 603 is positioned on a resistive layer 601. In some embodiments, the resistive layer 601 is a resistor. Each of the electric field enhancers 603 has a tapered cone shape with essentially a same height. As shown in FIG. 6B, in some embodiments, the tapered cone shaped electric field enhancer 603 includes at least one sharp bent 603A having an angle of about or more than 90 degrees and at least one sharp bent 603A' having an angle of about or less than 90 degrees. As shown in FIG. 6A, two surfaces composing the sharp bent 603A include a sidewall 603' and a bottom surface 603B or a top surface 603C of each tapered cone shaped electric field enhancer 603.

In some embodiments, an area of the top surface 603C is 0.5 times the area of the bottom surface 603B. In certain embodiments, the area of the top surface shrinks to a point such that the electric field enhancer 603 has a cone shape.

Figure 6C:
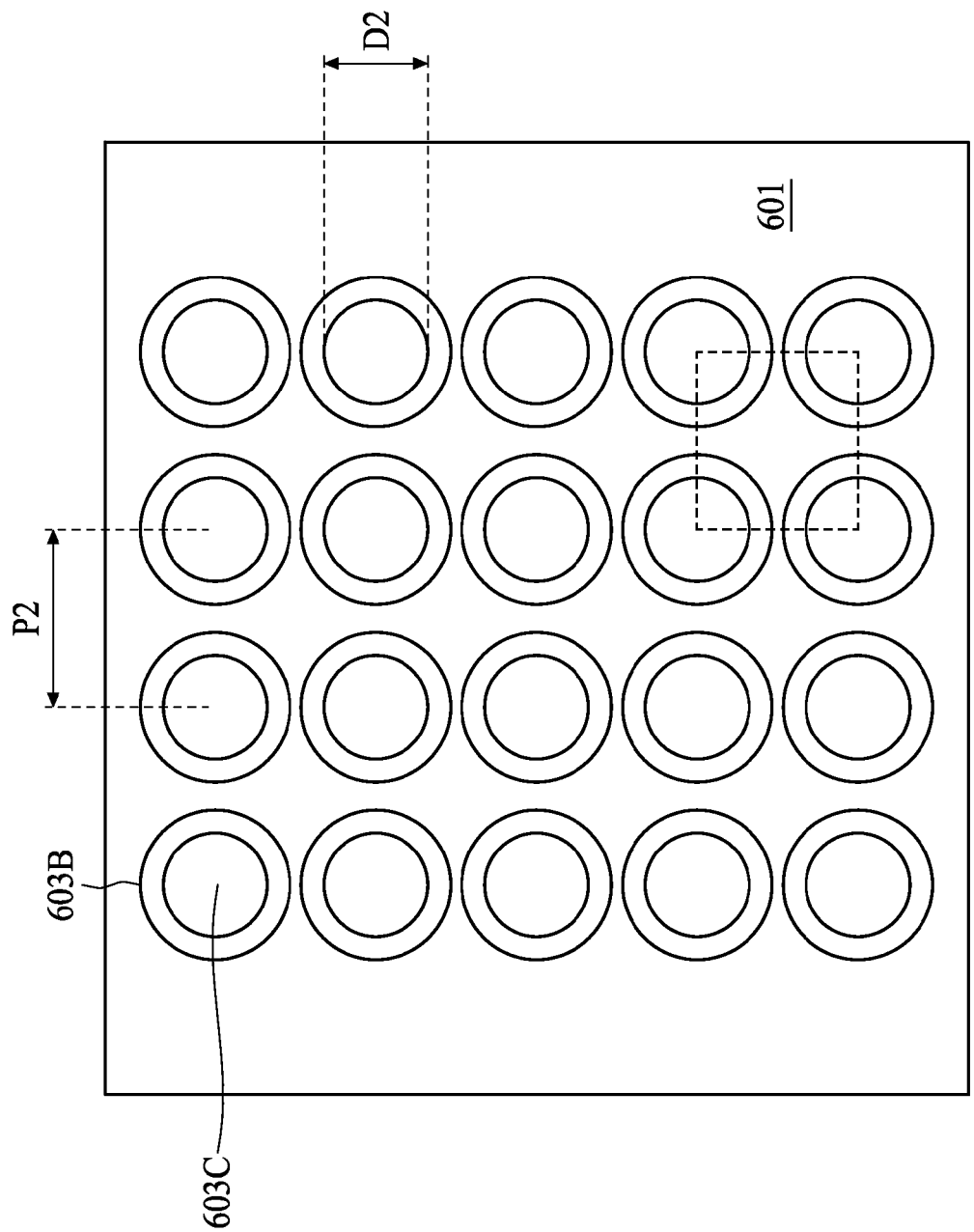
FIG. 6C is a top view of an electric field enhancement array in an RRAM according to some embodiments of the present disclosure.

FIG. 6C is a top view of the cross section along line AA in FIG. 2 according to some embodiments of the present disclosure. Referring to the description associated with FIG. 6A, several electric field enhancers 603 (metal dots) are arranged in a square symmetry on a resistive layer 601. An area surrounded by dotted lines demonstrates a square unit cell of the electric field enhancement array 602.

As shown in FIG. 6C, a separation P2 between two adjacent electric field enhancers 603 is about or less than 20 nm. A greatest dimension of the electric field enhancer 603 is a diameter D2 on a top surface 603C of the tapered cone shaped electric field enhancer 603. In certain embodiments, the diameter D2 is about or less than 20 nm. In certain embodiments, the area density of the electric field enhancers 603 is 0.5 electric field enhancer per nanometer square.

Figures 7A, 7B:
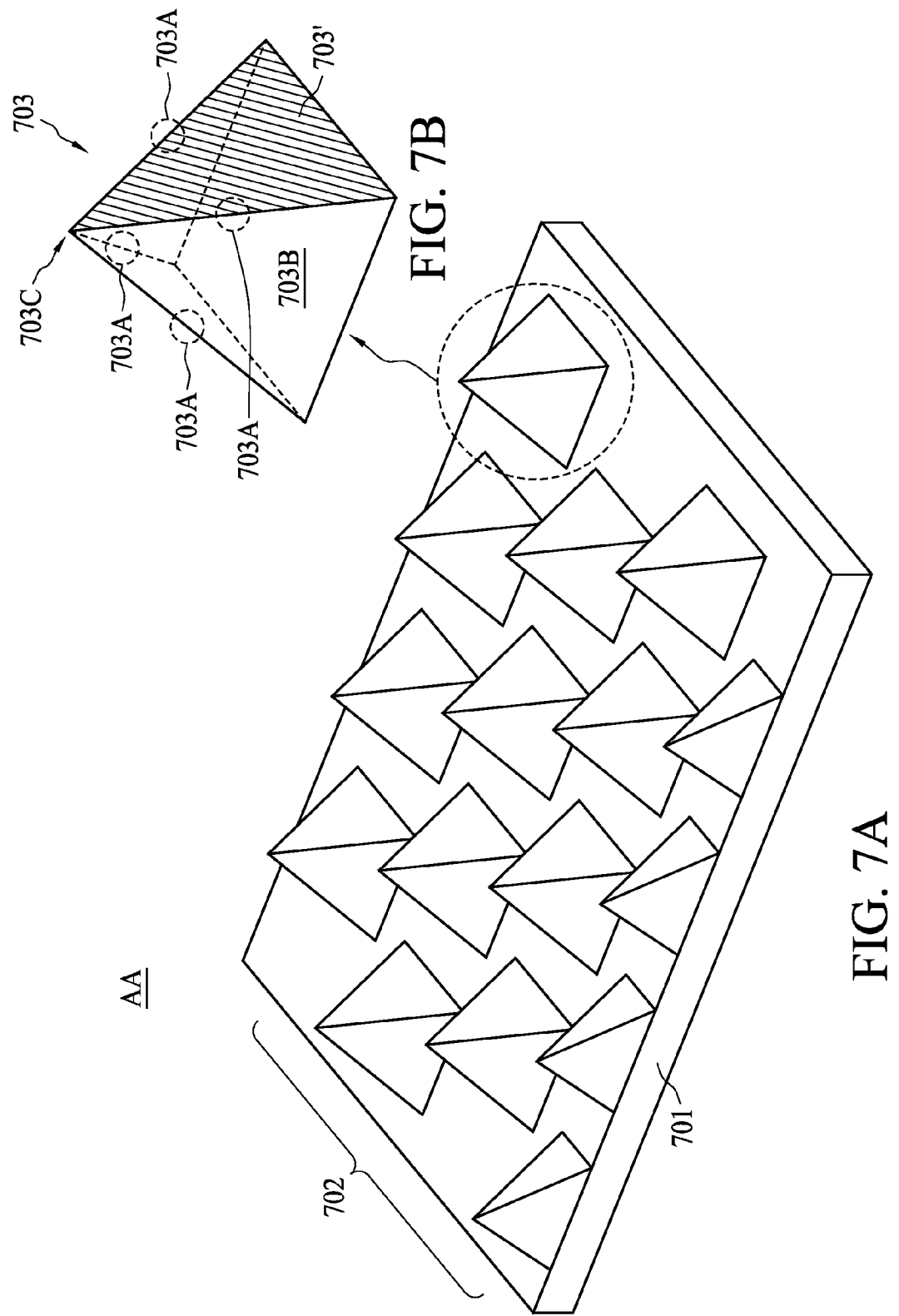
FIG. 7A is a perspective view of an electric field enhancement array in an RRAM according to some embodiments of the present disclosure.
FIG. 7B is an enlarged perspective view of an electric field enhancer in an RRAM according to some embodiments of the present disclosure.

FIG. 7A is a perspective view of the cross section along line AA in FIG. 2 according to some embodiments of the present disclosure. In FIG. 7A, an electric field enhancement array 702 including several electric field enhancers 703 is positioned on an resistive layer 701. In some embodiments, the resistive layer 701 is a resistor. Each of the electric field enhancers 703 has a pyramidal shape with essentially a same height. As shown in FIG. 7B and FIG. 7D, in some embodiments, the pyramidal shaped electric field enhancer 703 includes at least four sharp bents 703A having an angle of about or more than 90 degrees. Two surfaces composing the sharp bents 703A include any of the two adjacent sidewalls 703'. In certain embodiments, a tip 703C is positioned at the top of each pyramidal shape electric field enhancer 703.

In some embodiments, an area of the tip 703C is 0.05 times the area of the bottom surface 703B. In certain embodiments, the area of the top surface broadens to 0.5 times the area of the bottom surface 703B such that the electric field enhancer 703 becomes a truncated cone shape.

Figure 7C:
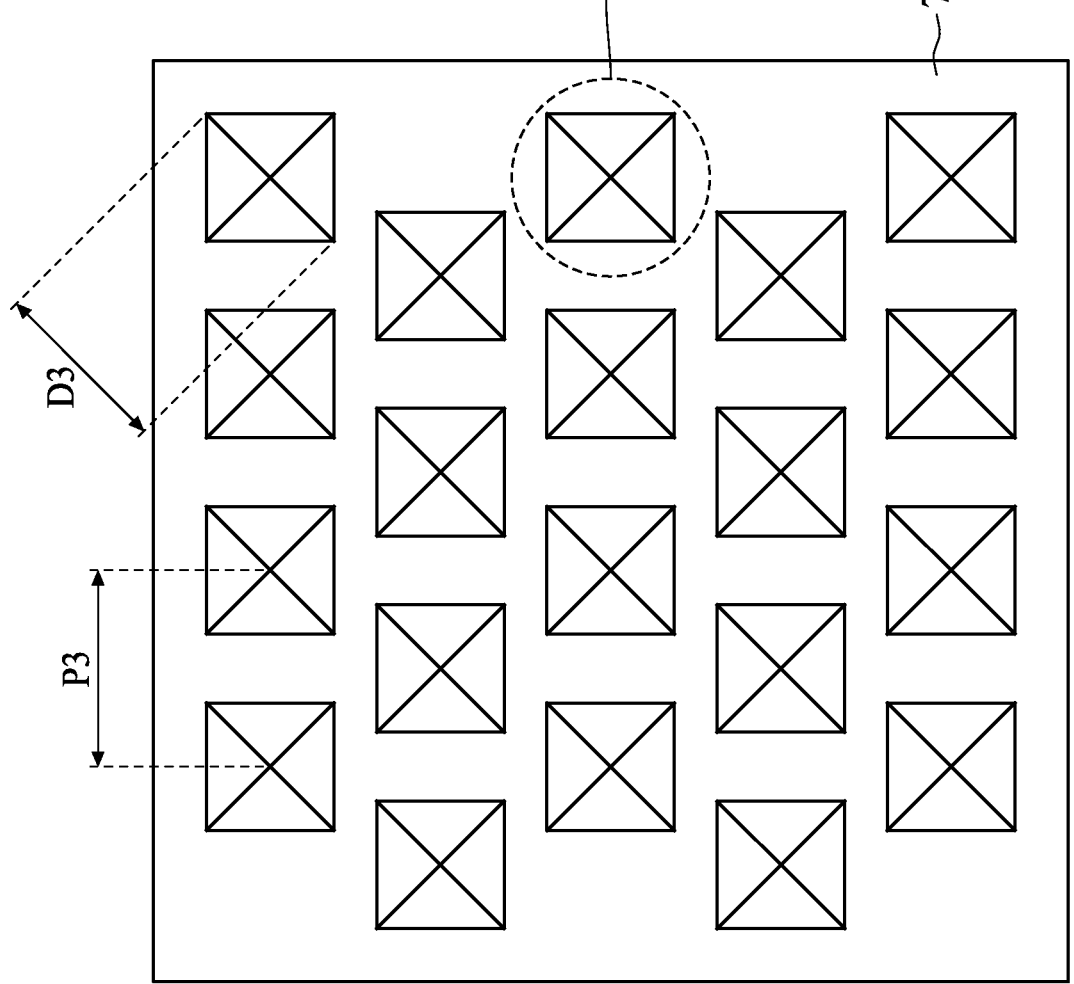
FIG. 7C is a top view of an electric field enhancement array in an RRAM according to some embodiments of the present disclosure.
Figure 7D:
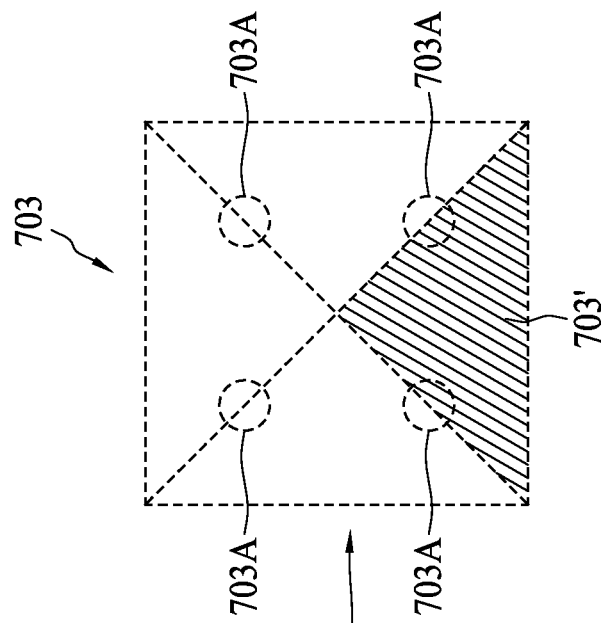
FIG. 7D is an enlarged top view of an electric field enhancer in an RRAM according to some embodiments of the present disclosure.

FIG. 7C is a top view of the cross section along line AA in FIG. 2 according to some embodiments of the present disclosure. Referring to the description associated with FIG. 7A, several electric field enhancers 703 (metal dots) are arranged in a hexagonal symmetry on a resistive layer 701.

As shown in FIG. 7C, a separation P3 between two adjacent electric field enhancers 703 is about or less than 25 nm. A greatest dimension of the electric field enhancer 703 is a diagonal D3 of the bottom surface 703B of the electric field enhancer 703. In certain embodiments, the diagonal D3 is about or less than 35 nm. In certain embodiments, the area density of the electric field enhancers 703 is 0.4 electric field enhancer per nanometer square.

Figure 8:
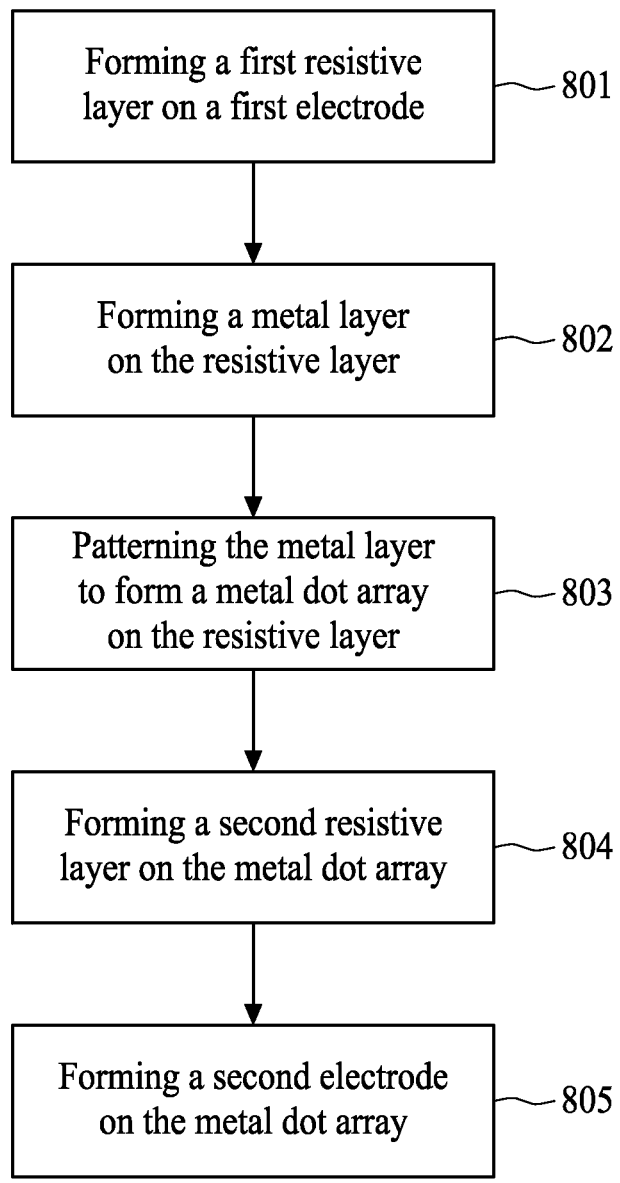
FIG. 8 is a flowchart of a method of forming a resistor in an RRAM according to some embodiments of the present disclosure.

Referring now to FIG. 8, a flowchart of the method 800 of manufacturing a resistor structure in a resistive random access memory (RRAM). A first resistive layer is deposited on a first electrode in operation 801. In one embodiment, the first electrode is a bottom electrode. The first electrode is deposited on an etch stop layer made of dielectric materials and electrically connected to a conductive structure. Additional operation can be provided before, during, or after the method 800 of FIG. 8. Various figures have been simplified for a better understanding of the inventive concepts of the present disclosure.

Figure 9A:
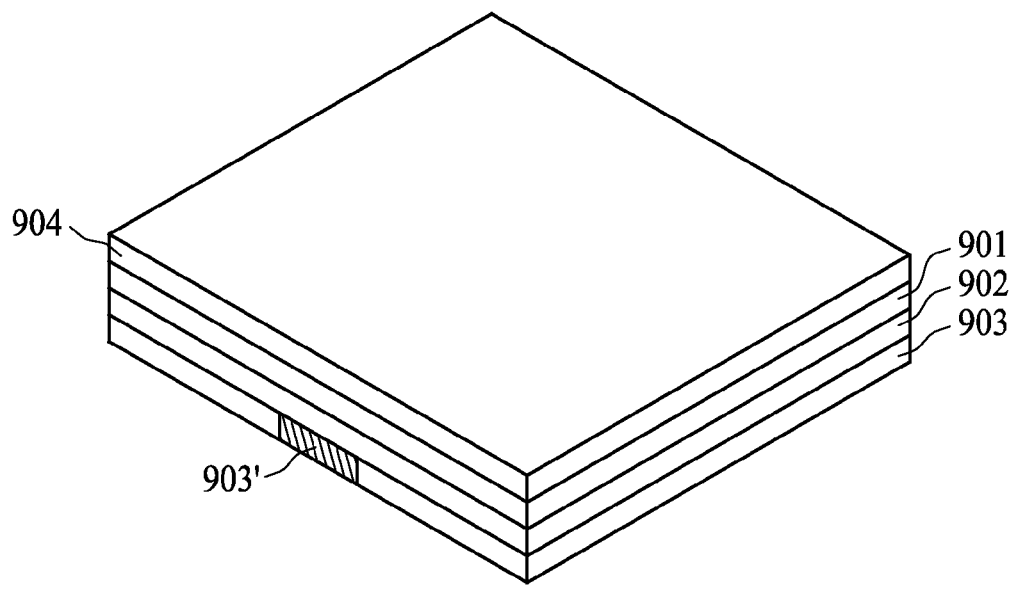
FIG. 9A to FIG. 9D are perspective views of a resistor having an electric field enhancement array at various stages of manufacturing according to some embodiments of the method in FIG. 8.

Referring to FIG. 9A, a first electrode 902 composed of at least one of the following materials Pt, AlCu, TiN, Au, Ti, Ta, TaN, W, WN, Cu is formed on a dielectric layer 903 and electrically connected to a conductive structure 903'. In some embodiments, the method forming the first electrode 902 includes electro-less plating, sputtering, electro plating, physical vapor deposition (PVD), or atomic layer deposition (ALD). One embodiment of the present disclosure adopts an electro plating operation to deposit a first electrode 902 of about 250 nm.

In FIG. 9A, a first resistive layer 901 including nickel oxide, titanium oxide, hafnium oxide, zirconium oxide, zinc oxide, tungsten oxide, aluminum oxide, tantalum oxide, molybdenum oxide or copper oxide is subsequently formed on the first electrode 902. In some embodiments, a deposition operation of the first resistive layer 901 includes chemical vapor deposition (CVD), ALD, high density plasma CVD (HDPCVD) or pulse laser deposition (PLD). One embodiment of the present disclosure adopts an ALD operation to deposit a first resistive layer 901 of 50 nm.

Referring back to FIG. 8, method 800 continues with operations 802 and 803. In operation 802, a metal layer is deposited on the resistive layer. In operation 803, the metal layer is patterned to form a metal dot array on the resistive layer.

Referring to FIG. 9A, a metal layer 904 is formed on the resistive layer 901 by at least one operation of electro-less plating, sputtering, electro plating, PVD, or ALD. In some embodiments, the metal layer 904 includes materials selected from the following: Pt, AlCu, TiN, Au, Ti, Ta, TaN, W, WN, Cu, Ni, Hf, Zr, or the like. The metal layer 904 is formed to have a thickness less than that of the first resistive layer 901.

Figure 9B:
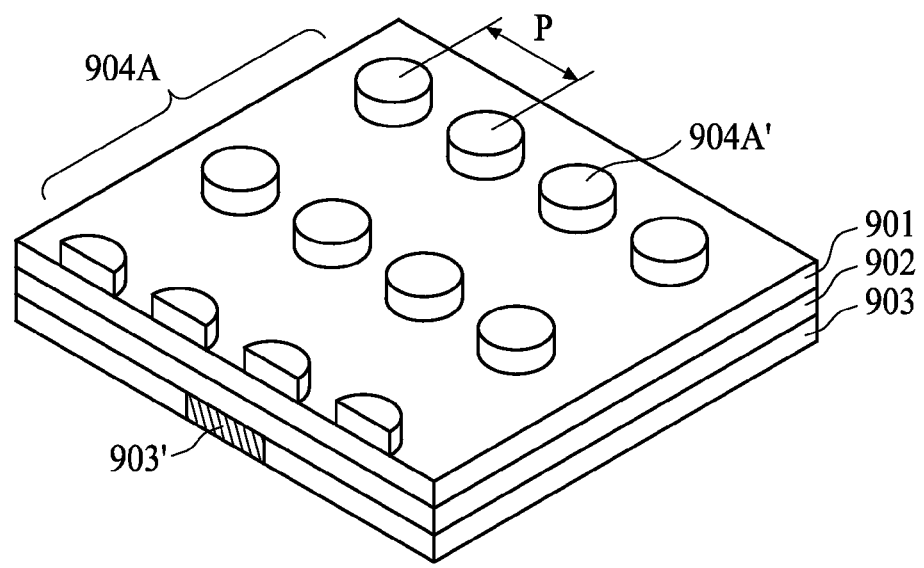

Referring to FIG. 9B, the previously deposited metal layer 904 is patterned into a metal dot array 904A. The metal dot array 904A includes several metal dots 904A arranged in a predetermined pattern and is disposed on a surface of the underlying resistive layer 901. In some embodiments, the patterning in operation 803 generates a metal dot array 904A having a separation P between two adjacent metal dots 904'. The separation P in certain embodiment is about or less than 40 nm.

Figure 10A:
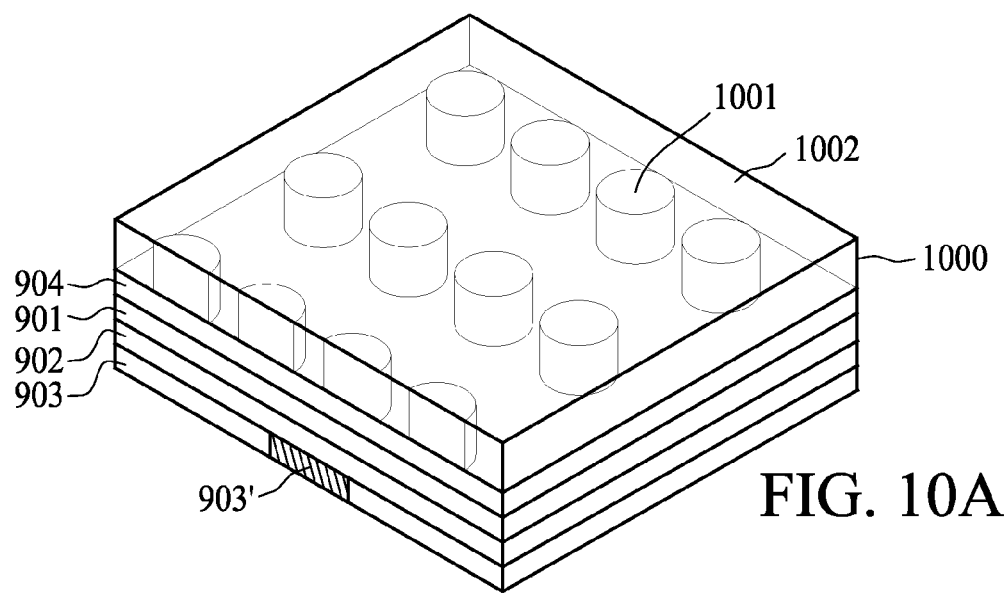
FIG. 10A to FIG. 10C are perspective views of a resistor having an electric field enhancement array at various stages of manufacturing according to some embodiments of the method in FIG. 8.
Figure 10B:
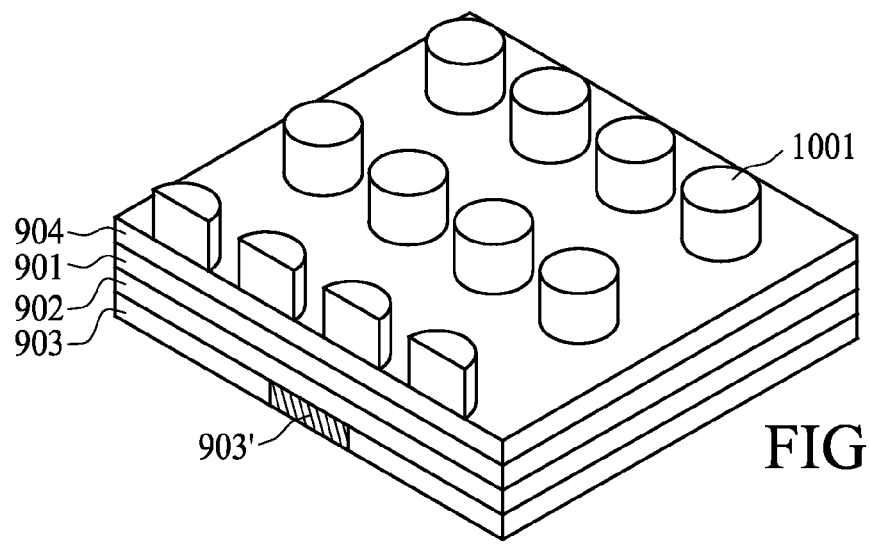
Figure 10C:
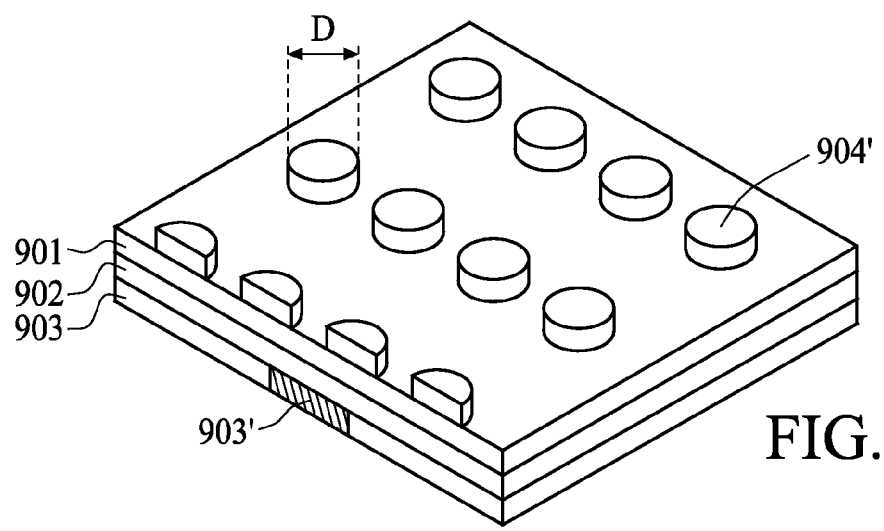

In some embodiments, the patterning in operation 803 includes a formation of a hard mask by a block copolymer direct self assembly (DSA) operation. FIG. 10A to 10C show perspective views of using a block copolymer DSA operation to transform a blanket metal layer to a metal dot array, each metal dot having a cylindrical shape. Referring to FIG. 10A, a hard mask layer 1000 consists of polystyrene (PS) pillars 1001 and a poly methylmethacrylate (PMMA) matrix 1002. In some embodiments, when a specific PMMA/PS volume fraction (for example, 70/30) is introduced, the block copolymer DSA operation results in a PMMA/PS domain separation as shown in FIG. 10A.

In FIG. 10B, the PMMA matrix is removed by a selective etch using a chloride-based etchant, a fluoride-based etchant, acetic acid, and/or oxygen plasma treatment. The remainder of the PS pillars 1001 is subsequently used as a patterned hard mask transferring the circular pattern into the underlying metal layer 904 and turning it into metal dots 904' as shown in FIG. 10C. In some embodiments, the region in metal layer 904 not protected by the PS pillars 1001 hard mask is removed by the mixture of phosphoric acid ($H_3PO_4$, 80%), acetic acid ($CH_3COOH$, 5%), nitric acid ($HNO_3$, 5%), and water ($H_2O$, 10%). In some embodiments, the metal layer 904 is removed by a 1:1 mixture of hydrogen peroxide and sulfuric acid. In certain embodiments, each metal dots 904' in FIG. 10C has a greatest dimension that is the diameter D of the circular top surface of 30 nm.

Figure 11A:
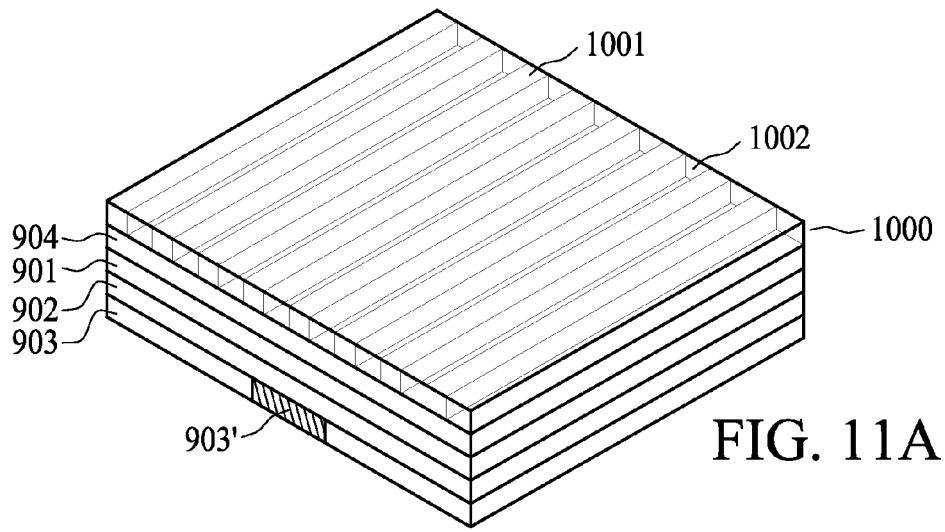
FIG. 11A to FIG. 11C are perspective views of a resistor having an electric field enhancement array at various stages of manufacturing according to some embodiments of the method in FIG. 8.
Figure 11B:
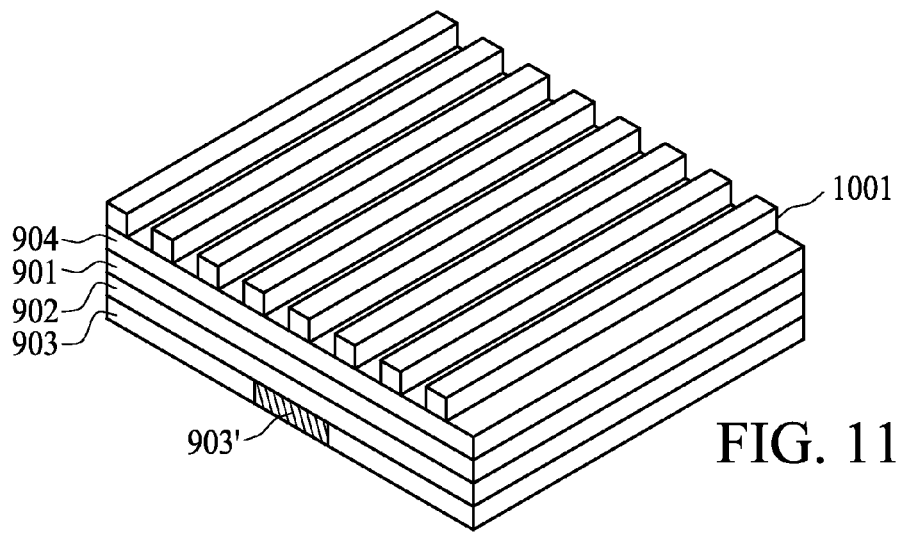
Figure 11C:
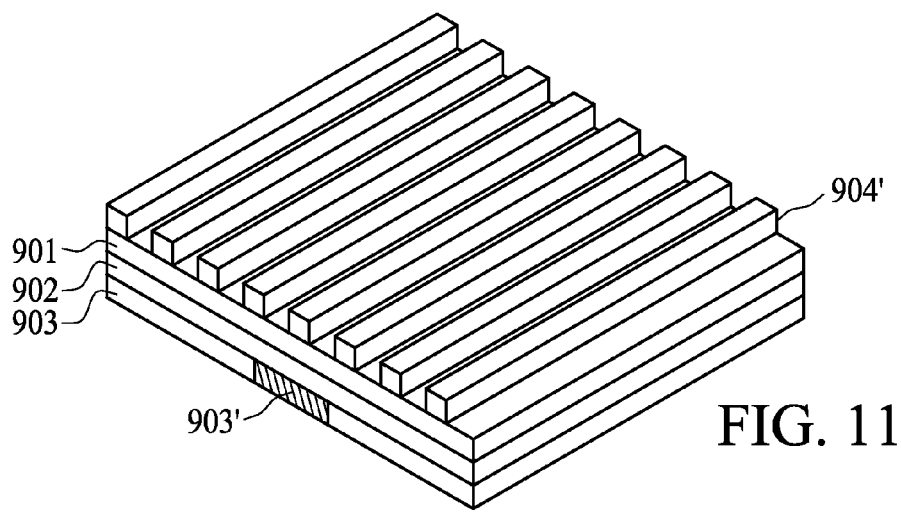

In some embodiments, the metal layer patterning in operation 803 includes a formation of a hard mask by a block copolymer direct self assembly (DSA) operation. FIG. 11A to 11C show perspective views of another block copolymer DSA operation to transform a blanket metal layer to a metal stripe array. Referring to FIG. 11A, a hard mask layer 1000 consists of polystyrene (PS) stripes 1001 and poly methylmethacrylate (PMMA) matrix 1002. In some embodiments, when a specific PMMA/PS volume fraction (for example, 50/50) is introduced, the block copolymer DSA operation results in a PMMA/PS domain separation as shown in FIG. 11A.

In FIG. 11B, the PMMA matrix is removed by a selective etch. The remainder of the PS stripes 1001 is subsequently used as a patterned hard mask transferring the rectangular pattern into the underlying metal layer 904 and turning it into metal stripes 904' as shown in FIG. 11C. In some embodi-ments, the region in metal layer 904 not protected by the PS stripes 1001 hard mask is removed. The etching method can be referred to the description associated with FIG. 10A to FIG. 10C and is not repeated here.

Figure 12A:
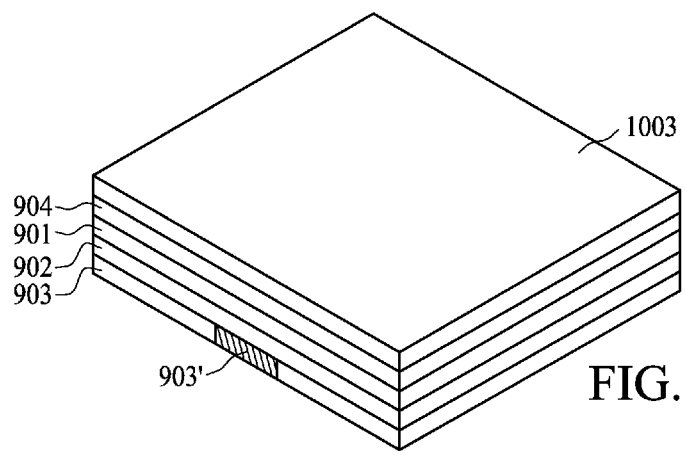
FIG. 12A to FIG. 12C are perspective views of a resistor having an electric field enhancement array at various stages of manufacturing according to some embodiments of the method in FIG. 8.
Figure 12B:
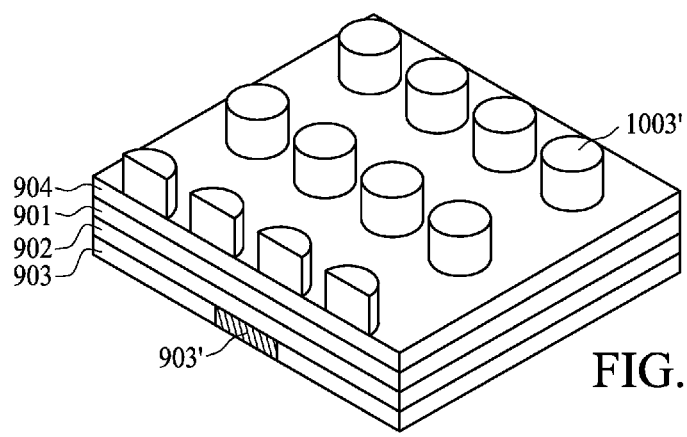
Figure 12C:
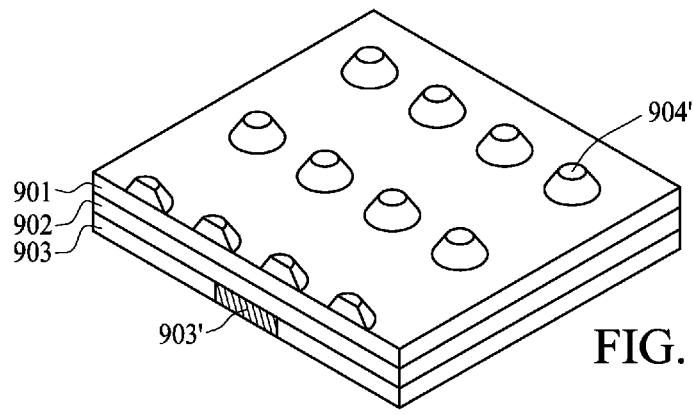

In some embodiments, the metal layer patterning in operation 803 includes a formation of a hard mask by a photolithography operation. FIG. 12A to 12C show perspective views of a photolithography operation to transform a blanket metal layer to a metal dot array, each metal dot having a shape of tapered cone. Referring to FIG. 12A, a hard mask layer 1003 consisting of silicon oxides is formed on the metal layer 904. In some embodiments, a photoresist layer (not shown) with a circular pattern is formed on the hard mask layer 1003 and a patterned hard mask 1003' is formed on the underlying metal layer 904 as shown in FIG. 12B after a proper first etching operation. The first etching operation can be a wet etch or a dry etch operation. In FIG. 12B, the patterned hard mask 1003' has a shape of cylinder.

In FIG. 12B and FIG. 12C, a second etching operation is applied to remove the portion of the metal layer 904 not protected by the patterned hard mask 1003' and resulting in metal dots 904' on the resistive layer 901. The second etching operation applied here is an isotropic etch operation and preventing the metal dots 904' to have a vertical sidewall. In FIG. 12C, the metal dot 904' has a shape of tapered cone. In certain embodiments, the sidewall of the metal dots 904' is both tapered and concave.

Referring back to FIG. 7A, in some embodiments, the pyramidal shaped electric field enhancers 703 are obtained at least by a anisotropic etching operation. For example, etching rates at various facets of an electric field enhancer 703 are different, and hence the facet with a greatest etching rate is preserved after an anisotropic, or a crystal orientation dependant etching operation. In FIG. 7D, the remained four sidewalls 703' are the facets with highest etching rate.

Referring back to FIG. 8, method 800 continues with operations 804. In operation 804, a second resistive layer is deposited on the metal dot array formed in operation 803.

Figure 9C:
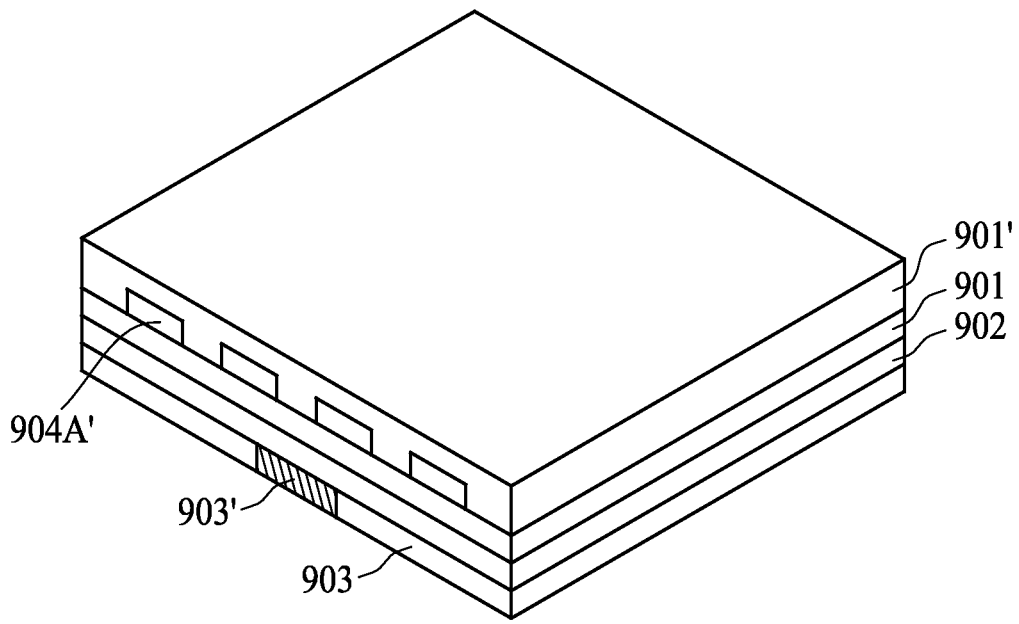

Referring to FIG. 9C, a second resistive layer 901' including nickel oxide, titanium oxide, hafnium oxide, zirconium oxide, zinc oxide, tungsten oxide, aluminum oxide, tantalum oxide, molybdenum oxide or copper oxide is subsequently formed on the metal dots 904'. In some embodiments, a deposition operation of the second resistive layer 901 includes chemical vapor deposition (CVD), ALD, high density plasma CVD (HDPCVD) or pulse laser deposition (PLD). One embodiment of the present disclosure adopts an ALD operation to deposit a second resistive layer 901' of 50 nm. The second resistive layer 901' fills the space between two adjacent metal dots 904'. In some embodiments, the first resistive layer 901 and the second resistive layer 901' are made of different materials.

Referring back to FIG. 8, method 800 continues with operations 805. In operation 805, a second electrode is deposited over the metal dot array formed in operation 803 and the second resistive layer formed in operation 804.

Figure 9D:
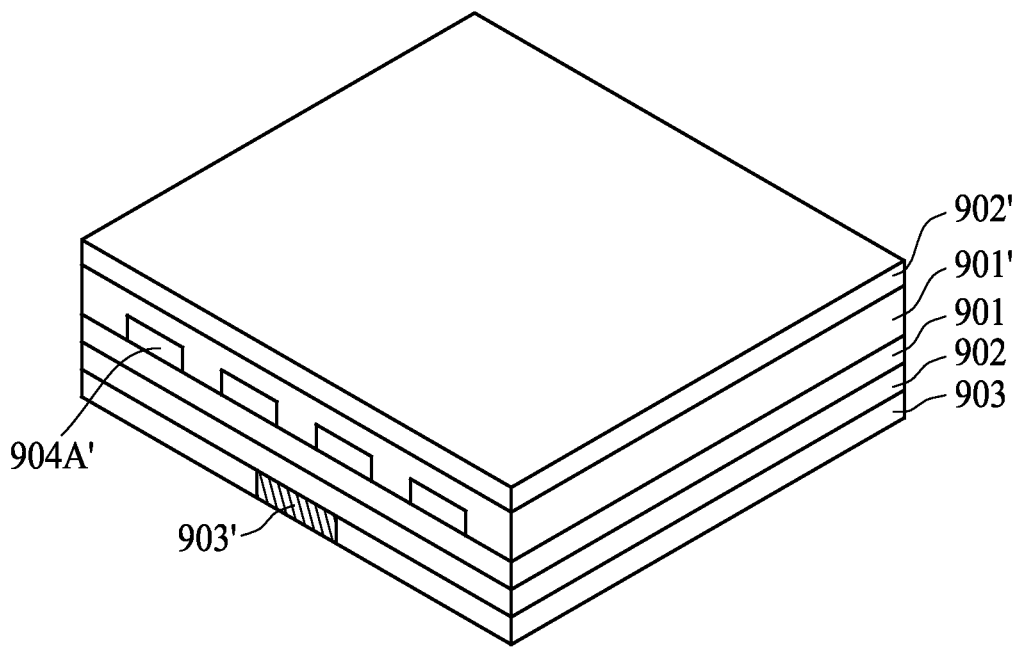

Referring to FIG. 9D, a second electrode 902' composed of at least one of the following materials Pt, AlCu, TiN, Au, Ti, Ta, TaN, W, WN, Cu is formed over the second resistive layer 901' and the metal dots 904A' formed in operation 803. In some embodiments, the method forming the second electrode 902' includes electro-less plating, sputtering, electro plating, physical vapor deposition (PVD), or atomic layer deposition (ALD). One embodiment of the present disclosure adopts an electro plating operation to deposit a second electrode 902' of about 200 nm. In some embodiments, the first electrode 902 and the second electrode 902' are made of different materials.

One embodiment in the present disclosure provides a resistor in a resistive random access memory (RRAM). The resistor in an RRAM comprises a first electrode; a resistive layer on the first electrode; an electric field enhancement array in the resistive layer; and a second electrode on the resistive layer, wherein the electric field enhancement array comprises a plurality of electric field enhancers arranged in a same plane.

One embodiment in the present disclosure provides a resistive random access memory (RRAM). The RRAM comprises a first electrode; a second electrode over the first electrode; and a resistor between the first electrode and the second electrode, wherein the resistor includes a plurality of electric field enhancers.

One embodiment in the present disclosure provides a method of manufacturing a resistor structure in a resistive random access memory (RRAM). The method comprises (1) forming a first resistive layer on a first electrode; (2) forming a metal layer on the resistive layer; (3) patterning the metal layer to form a metal dot array on the resistive layer; and (4) forming a second electrode on the metal dot array, wherein the metal dot array comprises a plurality of metal dots, and a distance between adjacent metal dots is less than 40 nm.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A resistor in a resistive random access memory (RRAM), comprising:
a first electrode;
a resistive layer on the first electrode;
more than one electric field enhancement arrays parallel to a surface of the first electrode in the resistive layer, the more than one electric field enhancement arrays are positioned at different levels of the resistive layer; and
a second electrode on the resistive layer;
wherein one of the electric field enhancement arrays comprises a plurality of electric field enhancers arranged in a plane parallel to the surface of the first electrode, and
wherein one of the plurality of electric field enhancers comprises at least a bent at a predetermined position, the bent having an angle of about or greater than 90 degrees.

2. The resistor in claim 1, wherein one of the plurality of electric field enhancers comprises a metal dot.

3. The resistor in claim 2, wherein a greatest dimension on a cross section of the metal dot is less than 40 nm, and wherein the cross section is parallel to the surface of the first electrode.

4. The resistor in claim 3, wherein a separation between adjacent metal dots is less than 40 nm.

5. The resistor in claim 2, wherein the metal dot is made of a material selected from the group consisting essentially of Pt, AlCu, TiN, Au, Ti, Ta, TaN, W, WN, Cu, Ni, Hf, Zr, and the combination thereof.

6. The resistor in claim 1, wherein a thickness of the resistive layer is less than 100 nm.

7. The resistor in claim 1, wherein one of the electric field enhancement arrays is in contact with the first electrode or the second electrode.

8. The resistor in claim 1, wherein the resistive layer is made of a material selected from the group consisting essentially of NiO, TiO, HfO, ZrO, $WO_3$, $Al_2O_3$, TaO, MoO, CuO, and the combination thereof.

9. The RRAM in claim 1, wherein one of the more than one electric field enhancement arrays is arranged into a two dimensional array.

10. The resistor in claim 1, wherein an electric field enhancer of the one of the plurality of electric field enhancer arrays further comprises at least one bent having an angle of about or lower than 90 degrees.

11. The RRAM in claim 1, wherein the electric field enhancer of the more than one electric field enhancement arrays comprises a truncated cone.

* * * * *